United States Patent [19]
Kameyama et al.

[11] Patent Number: 5,748,053
[45] Date of Patent: May 5, 1998

[54] SWITCHING CIRCUIT

[75] Inventors: Atsushi Kameyama, Sagamihara; Katsue Kawakyu, Kawasaki; Yoshiko Ikeda, Yokohama, all of Japan

[73] Assignee: Kabushiki Kaisha Toshiba, Kawasaki, Japan

[21] Appl. No.: 723,229

[22] Filed: Sep. 27, 1996

[30] Foreign Application Priority Data

Sep. 28, 1995 [JP] Japan .................. 7-250410
Jun. 7, 1996 [JP] Japan .................. 8-145355

[51] Int. Cl.⁶ ........................................ H03H 7/48
[52] U.S. Cl. .................. 333/103; 327/404; 327/408; 455/83
[58] Field of Search .................. 333/103, 104, 333/262; 327/408, 416, 404; 455/82, 83

[56] References Cited

U.S. PATENT DOCUMENTS

| | | | |
|---|---|---|---|
| 4,789,846 | 12/1988 | Matsunaga et al. | 333/104 |
| 4,810,911 | 3/1989 | Noguchi | 333/103 X |
| 5,039,873 | 8/1991 | Sasaki | 333/104 X |
| 5,477,184 | 12/1995 | Uda et al. | 333/103 X |
| 5,548,239 | 8/1996 | Kohama | 333/103 X |

OTHER PUBLICATIONS

ISSCC Digest of Technical Papers, TA 8.5, "A 3V MMIC Chip Set for 1.9GHz Mobile Communication Systems;" S. Tanaka et al. Feb. 1995; pp. 144–145.

*Primary Examiner*—Paul Gensler
*Attorney, Agent, or Firm*—Oblon, Spivak, McClelland, Maier & Neustadt, P.C.

[57] ABSTRACT

A switching circuit is made by serially connecting two field effect transistors in series in a small-signal transmission path, each of the transistors being applied with a substantially equal voltage, so as to lower a voltage applied to each of the FETs in the OFF state by voltage division, with the result that a high withstand voltage of the transmission path can be attained and a linear output can be obtained even when a large electric power is transmitted.

20 Claims, 11 Drawing Sheets

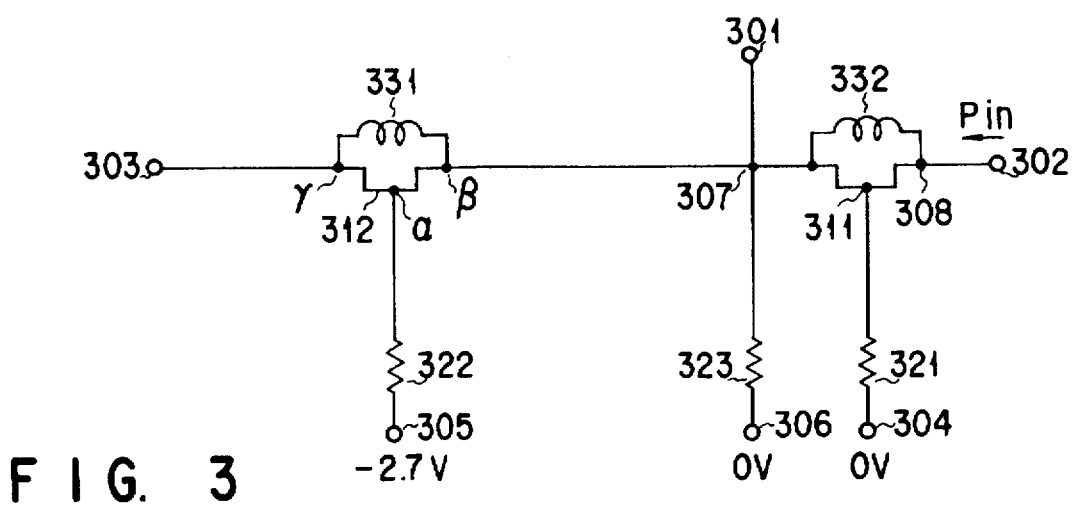
F I G. 3

FIG. 4A  Vα  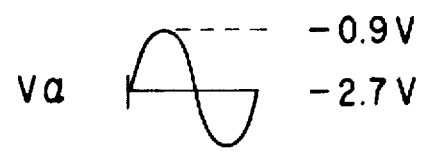
FIG. 4B  Vβ  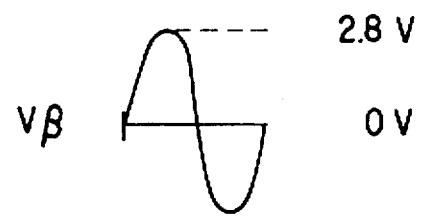
FIG. 4C  Vγ    0 V
FIG. 4D  Vαβ  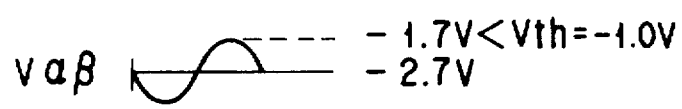
FIG. 4E  Vαγ  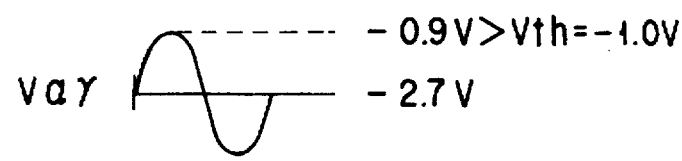
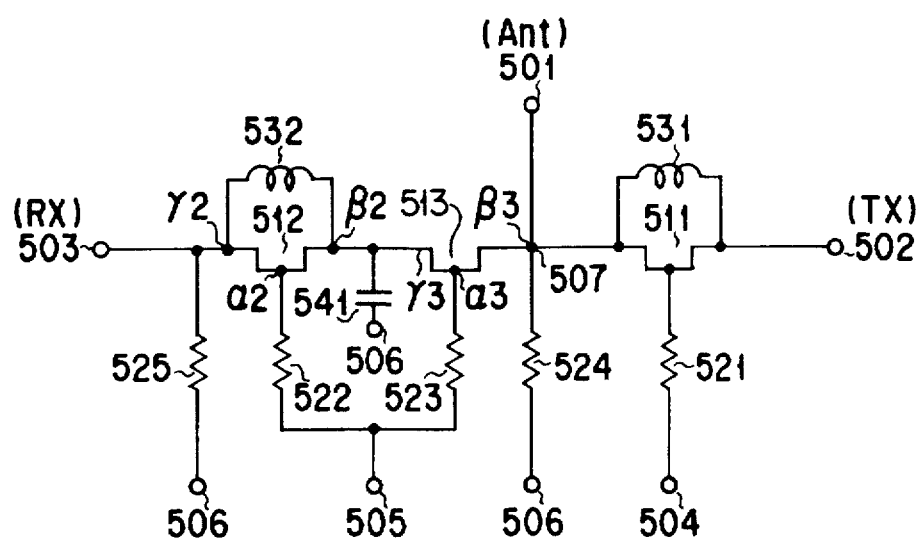
FIG. 5

○ ---- COMPARATIVE SAMPLE
△ ---- FIRST EMBODIMENT

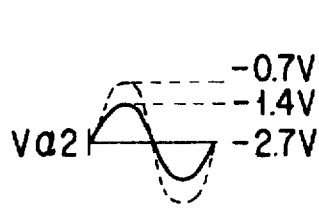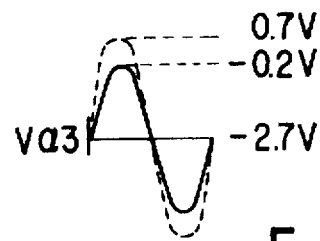
FIG. 10A   FIG. 10B
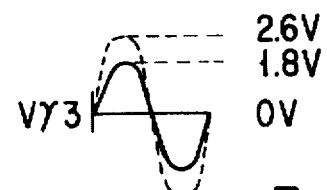
FIG. 10C   FIG. 10D
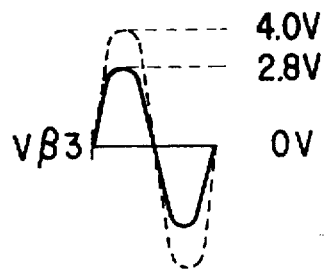
FIG. 10E
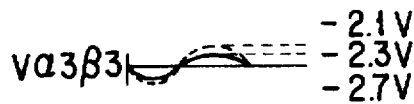
FIG. 10F
FIG. 10G
FIG. 10H
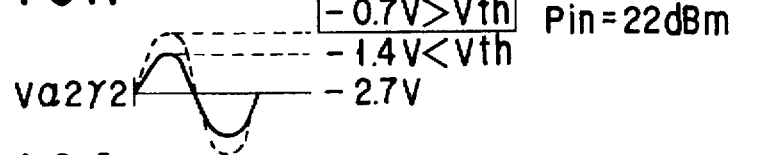
FIG. 10I

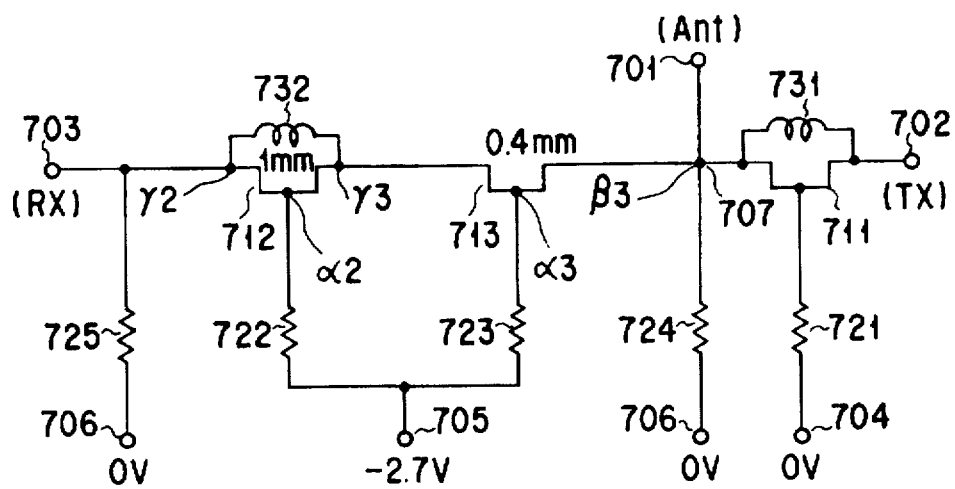
FIG. 14
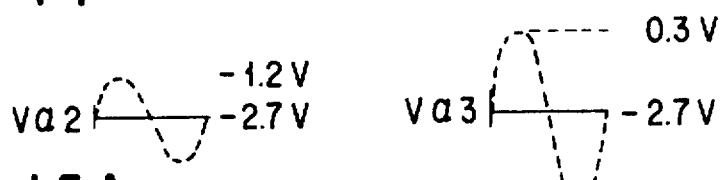
FIG. 15A
FIG. 15B
$V\gamma 2 \vdash\!\!\!\rule[0.5ex]{2em}{0.4pt}\!\!\!\!$ 0V
FIG. 15C
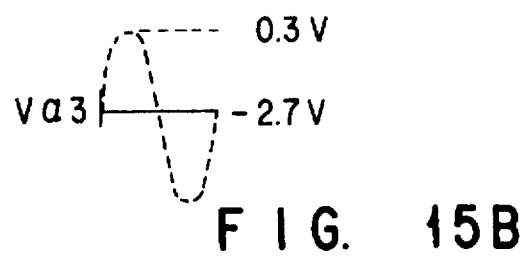
FIG. 15D
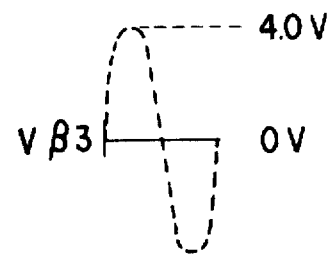
FIG. 15F
FIG. 15E
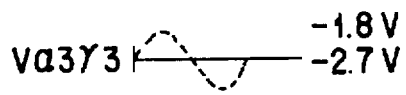
FIG. 15G
$V\alpha 2\gamma 3 \vdash\!\!\!\sim\!\!\! \begin{array}{c}-2.0\text{V}\\-2.7\text{V}\end{array}$
FIG. 15H
FIG. 15I

SWITCHING CIRCUIT

BACKGROUND OF THE INVENTION

1. Field of the Invention

This invention relates to a switching circuit for switching high frequency signals.

2. Description of the Related Art

With miniaturization of communication devices, portable type terminals are rapidly popularized. In order to meet various requirements of the market, various types of communication systems have been developed. In a simple portable telephone system called a PHS (Personal Handy-phone System), in order to reduce the size of the terminal, as shown in FIG. 1, a method using one antenna for switching transmission and reception by use of a high-frequency switch is used. As the high-frequency switch, an SPDT (Single-Pole Dual-Throw) switch is used. Since a weak signal is dealt with on the reception side and a power signal is dealt with on the transmission side, a power loss may sometimes occur in the switch at the transmission time. This problem is specifically explained below.

FIG. 2A is a circuit diagram of a conventional 3-terminal SPDT switching circuit operated on a negative power supply voltage. In the circuit of FIG. 2A, an input/output terminal 101 for high-frequency signal is connected to a signal input/output terminal 102 via a field effect transistor (which is hereinafter referred to as an FET) 111 and the signal input/output terminal 102 is grounded via an FET 113. The signal input/output terminal 101 is connected to a signal input/output terminal 103 via an FET 112 and the signal input/output terminal 103 is grounded via an FET 114. A gate signal input terminal 104 is connected to the gate of the FET 114 via a gate resistor 124 and to the gate of the FET 111 via a gate resistor 121. A gate signal input terminal 105 is connected to the gate of the FET 113 via a gate resistor 123 and to the gate of the FET 112 via a gate resistor 122. The gate resistors 121 to 124 have high resistances of several kΩ. The FETs 111 to 114 are depletion type FETs. For example, in a switching circuit for switching the state of the antenna of a digital cordless telephone to the transmission state or reception state, the signal input/output terminal 101 is used as the antenna signal terminal, the signal input/output terminal 102 is used as the terminal of the power transmission path on the transmission side, and the signal input/output terminal 103 is used as the terminal of the small signal transmission path on the reception side.

Next, the operation of the above switching circuit is explained. If 0 V is applied to the gate signal input terminal 104 and −3V is applied to the gate signal input terminal 105, the FETs 111 and 114 are both turned ON and the FETs 112 and 113 are both turned OFF. If a high-frequency signal is input from the signal input/output terminal 102, it is supplied to the signal input/output terminal 101 via the FET 111. At this time, the signal input from the signal input/output terminal 102 is influenced by the loss caused by the ON-resistance of the FET 111 and the capacitance of the FET 113 in the OFF state and the loss caused by the leakage due to the capacitance of the FET 112 in the OFF state and a signal obtained by subtracting the losses is output from the signal input/output terminal 101. Further, even if a current leaking via the capacitor of the FET 112 in the OFF state between the input/output terminals 101 and 103 on the OFF side, the current flows into the ground via the FET 114 in the ON state and thus high isolation can be attained.

While FIG. 2A shows an example of the conventional SPDT switch operated on 0 V and a negative power supply voltage of 3 V. FIG. 2B is a circuit diagram showing a conventional SPDT switching circuit operated on 0 V and a positive power supply voltage of 3 V. The switching circuit of FIG. 2B includes DC-cut capacitors 231 to 233 of several pF respectively connected between the respective input/output terminals 101 to 103 and connection nodes 107 to 109 in the switching circuit of FIG. 2A, a decoupling capacitor 234 of several pF connected between a connection node 210 and the GND terminal, and pull-up resistors 225 and 226 of several kΩ connected between the power supply terminal 206 kΩ connected between the power supply terminal 206 and the connection nodes 107 and 210. With the above construction, the switching voltage is raised to the reference potential 3 V. The operation of the above switching circuit is basically the same as the SPDT switching circuit operated on the negative power supply voltage and is different in that the reference potential is a positive potential of 3 V.

In the above high-frequency switch, for example, in a switch for switching the state of the antenna of a digital cordless telephone to the transmission state or reception state, the signal input/output terminal 102 is used as the terminal of the power transmission path on the transmission side, and the signal input/output terminal 103 is used as the terminal of the small signal transmission path on the reception side. At this time, when a signal input from the terminal 102 is supplied to the antenna terminal 101 via the ON-resistor of the FET 111, the signal is influenced by the loss caused by the capacitance of the FET 113 in the OFF state and the loss caused by the leakage current due to the capacitance of the FET 112 in the OFF state and the loss caused in a region from the terminal 102 on the transmission side to the antenna terminal 101 is increased.

When the functions of the FETs 113 and 114 connected in parallel with the respective transmission causing a current leaking via the capacitor of the FET 112 connected in series with the transmission path and set in the OFF state to flow into the GND terminal, thus attaining high isolation, but in this case, since the signal passes the capacitor of the FET 113 in the OFF state, the loss is increased.

Further, in the case of the SPDT switch operated on 0 V and the positive power supply voltage of 3 V shown in FIG. 2B, it is necessary to add the decoupling capacitor 234 of several pF between the connection node 210 and the GND terminal, the layout area becomes large if the circuit is realized by use of a monolithic microwave IC (MMIC). Further, since the circuit construction is greatly different in the cases of positive power supply and the negative power supply, the MMIC chip cannot be used commonly therefor. In addition, use of the FETs 113 and 114 connected in parallel with the respective transmission paths causes problems when it is required to reduce the loss, reduce the number of elements and enhance the flexibility of the MMIC chip.

SUMMARY OF THE INVENTION

An object of this invention is to provide a switching circuit having a high withstand voltage and capable of providing a linear output even when a larger electric power is transmitted.

In order to attain the above object, a switching circuit according to this invention comprises a first transmission path; a first input/output terminal connected to one end of the first transmission path; a second input/output terminal connected to the other end of the first transmission path; a second transmission path connected at one end to the second input/output terminal; and a third input/output terminal connected to the other end of the second transmission path; wherein the first transmission path includes a first field effect transistor having a first conduction path which is connected at one end to the first input/output terminal; a second field effect transistor having a second conduction path which is connected at one end to the other end of the first conduction path of the first field effect transistor and connected at the other end to the second input/output terminal; and a first inductor connected in parallel with the first conduction path of the first field effect transistor.

Further, the second transmission path preferably includes a third field effect transistor having a third conduction path which is connected between the second and the third input/output terminal; and a second inductor connected in parallel with the third conduction path.

A capacitance which the first field effect transistor has in an OFF state and the first inductor prefereably cause resonance at a preset frequency of the high-frequency signals.

A capacitance which the third field effect transistor has in an OFF state and the second inductor preferably cause resonance at a preset frequency of the high-frequency signals.

The switching circuit can be used to switch high-frequency signals of reception and transmission with the first input/output terminal connected to a reception circuit, the second input/output terminal connected to an antenna, and the third input/output terminal connected to a transmission circuit.

Further, the second input/output terminal is coupled to a reference potential via a resistor, and preset voltages are preferably applied to gate electrodes of the first and second field effect transistors via respective preset resistors so as to control conduction states of the first and the second conduction path, respectively.

The first and the second transistor is preferably a depletion type transistor.

Further, the second input/output terminal is coupled to a reference potential via a resistor, and a preset voltage is preferably applied to the gate electrode of the third field effect transistor via a preset resistor so as to control a conduction state of the third conduction path.

The third transistor is preferably a depletion type transistor.

The switching circuit preferably comprises a voltage terminal to which a preset voltage is applied and a capacitor connected between the other end of the first conduction path of the first transistor and the voltage terminal.

It is also possible to use a multi-finger type field effect transistor having a plurality of gate electrodes connected to one another as the second field effect transistor.

A gate width of the second field effect transistor is preferably made smaller than a gate width of the first field effect transistor.

When the second transistor is a multi-finger type transistor, a total gate width of a plurality of gate electrodes of the second transistor is preferably made smaller than a gate width of the first transistor.

The switching circuit may further comprise a voltage terminal to which a preset voltage is applied and a fourth transistor having a fourth conduction path connected between the other end of the first conduction path of the first transistor and the voltage terminal to which the preset voltage is applied.

According to this invention, with a construction made by serially connecting two or more field effect transistors (FETs) (or Dual-gate or cascode-connected FET) as a field effect transistor connected in series with the small-signal transmission path (reception path), a voltage applied to each of the FETs in the OFF state can be lowered by voltage division. As a result, the high withstand voltage of the transmission path can be attained and a linear output can be obtained even when a larger electric power is transmitted.

While the FET connected in series with the small-signal transmission path is constructed by the two-stage series-connected FETs, the low loss, high isolation, small number of elements, and the flexibility which are the advantages of the parallel-resonance type switch can be maintained.

Further, since the capacitor is connected to the connection node of the first and second FETs and the impedance associated with the second FET becomes substantially equal to the impedance associated with the first FET having the inductor for parallel resonance, the voltages applied between the sources and drains of the FETs can be adequately divided. Therefore, when a large signal is input, the OFF state of the FET can be maintained in the more preferable condition and the linear characteristic can be further enhanced.

Since the gate width of the second FET (the total gate width in the case of multi-finger type) connected in the path in which the transmission signal power is relatively small is made smaller than the gate width of the first FET having the inductor for parallel resonance, the voltage applied to the FET can be adequately divided. Therefore, even when a large signal is input, the FET can be adequately kept in the OFF state and the linear characteristic can be further enhanced.

By additionally using the fourth FET having the drain connected to the node of the drain of the first FET and the source of the second FET, the voltage applied between the sources and drains of the first and second FETs can be adequately divided, and therefore, when a large signal is input, the FET can be adequately kept in the OFF state and the linear characteristic can be attained without being influenced by variations in the transistor characteristics caused in the manufacturing process. As a result, the manufacturing yield of the switches can be enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a circuit diagram for illustrating a parallel resonance type switching circuit devised by the inventors of this application;

FIGS. 4A to 4E are voltage waveform diagrams showing voltages on nodes or between nodes in the circuit shown in FIG. 3A on the same time base;

FIG. 5 is a circuit diagram of a parallel resonance type switching circuit according to a first embodiment of this invention;

FIGS. 10A to 10I are voltage waveform diagrams showing voltages on nodes or between nodes in the circuit shown in FIG. 9 on the same time base;

FIG. 14 is a circuit diagram of a parallel resonance type switching circuit according to a third embodiment of this invention;

FIGS. 15A to 15I are voltage waveform diagrams showing voltages on nodes or between nodes in the circuit shown in FIG. 14 on the same time base;

DETAILED DESCRIPTION OF THE PREFERRED EMBODIMENTS

Figure 1:
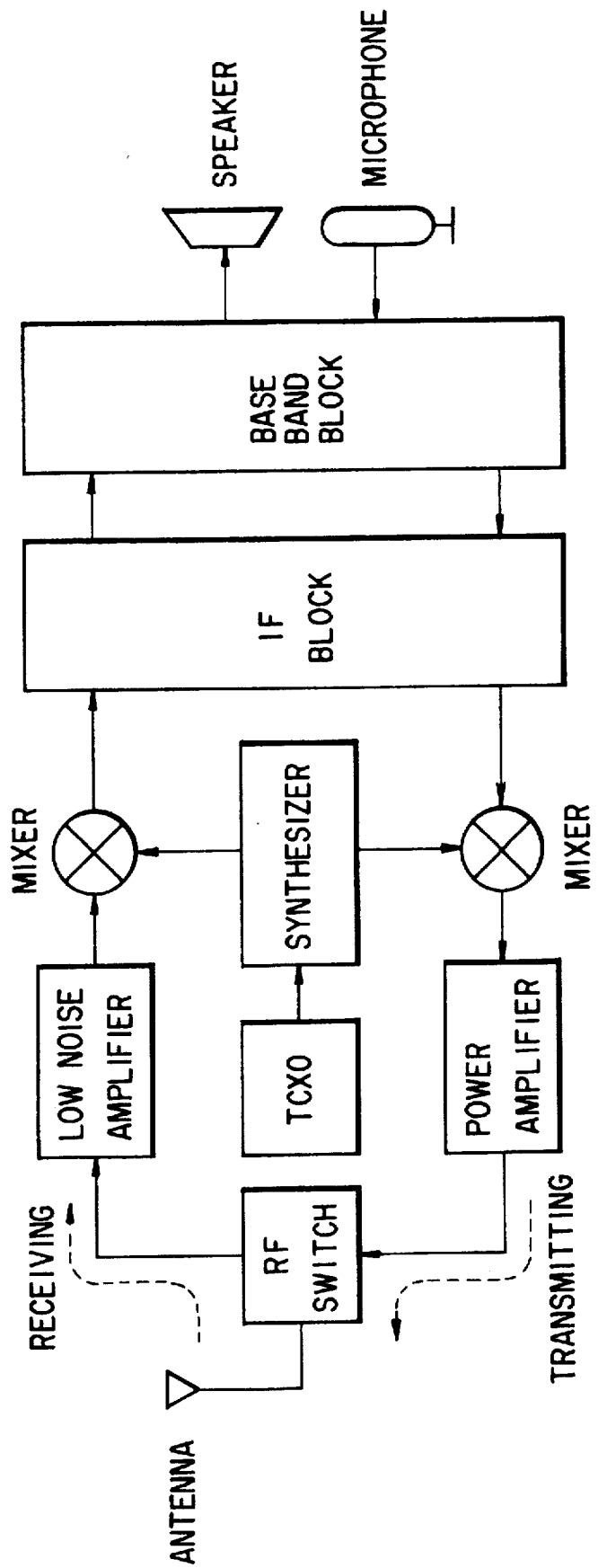
FIG. 1 is a block diagram of a general PHS portable telephone.
Figure 2:
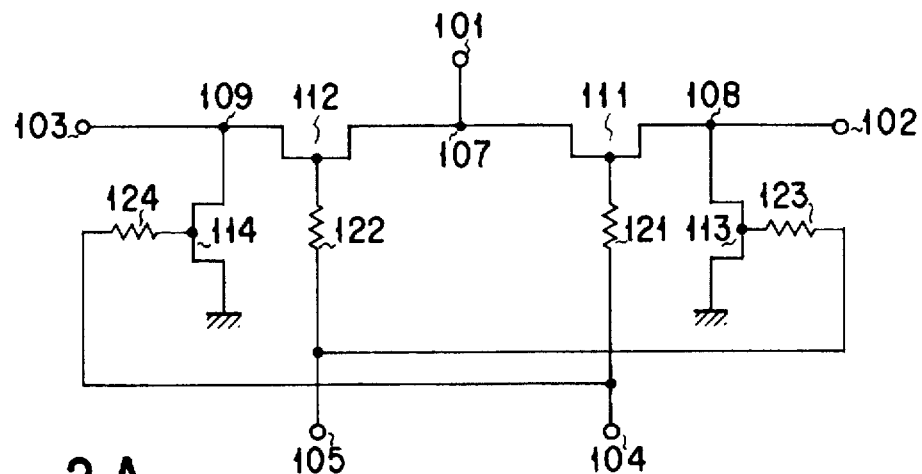
FIGS 2A and 2B are circuit diagrams of a conventional high-frequency switch, FIG. 2A showing the case of negative power supply voltage operation and FIG. 2B showing the case of positive power supply voltage operation.
Figure 2:
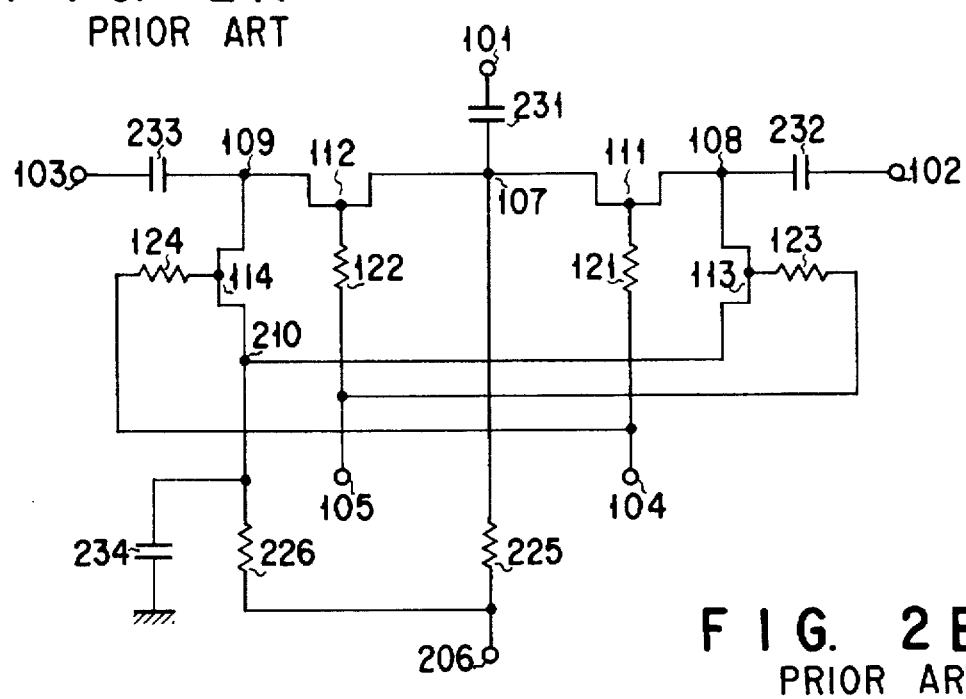
Figure 6A:
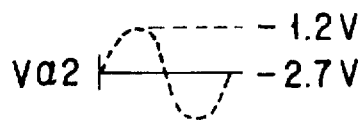
FIGS. 6A to 6I are voltage waveform diagrams showing voltages on nodes or between nodes in the circuit shown in FIG. 5 on the same time base.
Figure 6B:
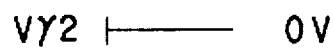
Figure 6C:
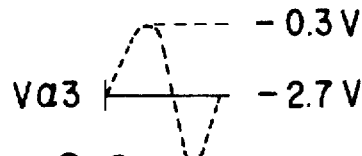
Figure 6D:
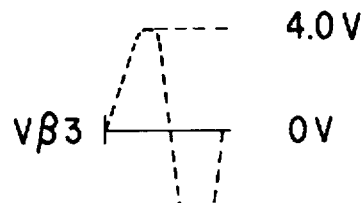
Figure 6E:
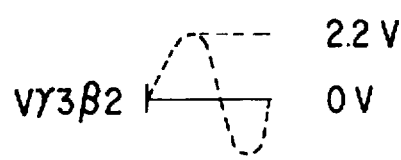
Figure 6F:
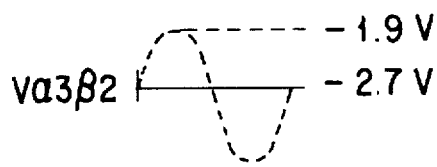
Figure 6G:
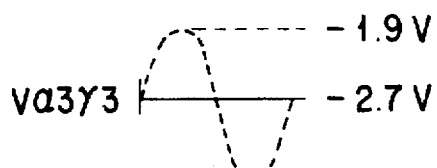
Figure 6H:
Figure 6I:

Before explaining the embodiments of this invention, the parallel resonance type switching circuit devised by the inventors of this application is explained. As shown in FIG. 3, in the circuit, the FETs 113 and 114 connected in parallel with the respective transmission paths as is observed in the conventional SPDT switching circuit (for example, FIGS. 2A and 2B) are not used. Further, in this circuit, inductors 331 and 332 which resonate with capacitors of OFF-state FETs 312 and 311 connected in series with the respective transmission paths are connected between the source electrodes and drain electrodes of the respective FETs 312 and 311, a power supply terminal 306 for setting a reference potential is connected to a connection node 307 of the FETs 311 and 312 via a high-resistance resistor 323, and control voltages are applied to the gates of the FETs via high-resistance resistors 322 and 321.

The impedances of the respective transmission paths in a case wherein the FETs 311 and 312 connected in series with the transmission paths are set in the OFF state become extremely large since the inductors 331 and 332 and the capacitors of the OFF-state FETs 312 and 311 resonate in a preset frequency range. Therefore, currents leaking through the capacitors of the OFF-state FETs can be reduced and the FETs 113 and 114 which are conventionally connected in parallel with the respective transmission paths can be omitted. By omitting the FETs 113 and 114 which are connected in parallel with the respective transmission paths, high isolation can be attained, the loss can be reduced and the number of elements used can be reduced.

When the switch is embodied in a form of an MMIC and if a DC-cut capacitor is attached to the external portion of the MMIC, the circuit on the MMIC can be formed with exactly the same construction for the positive power supply and for the negative power supply and thus an MMIC chip with high flexibility can be obtained.

However, the above circuit has a problem that a linear output cannot be obtained and the signal is distorted when a large signal is input. For example, when a signal is input via the terminal 302 on the transmission side and supplied to the antenna terminal 301 via the ON-state FET 311, the signal is distorted. Voltages of the gate electrode and the source or drain electrode of the FET 312 in the OFF state are influenced by the input signal via the coupling capacitors Cgs, Cgd and Cds, which are a parasitic capacitance between a gate and a source, a parasitic capacitance between a gate and a drain, and a parasitic capacitance between a drain and a source, respectively, of the FET and each of the amplitudes thereof becomes an AC amplitude dependent on the input amplitude, and if the amplitude exceeds the threshold voltage of the FET 312, the FET 312 which is set in the OFF state will be turned ON in AC terms. As a result, the waveform of the signal is distorted and the second order distortion and third order distortion other than the fundamental wave are generated and may cause interference waves.

In the above circuit, the relation between the input power (which is referred to as Pin) from the power amplifier circuit side and the second order distortion (which is referred to as 2fo) when the gate width Wg of each of the FETs 311 and 312 was set to 1 mm, Vth (a threshold voltage of an FET) was set to 1.0 V, L of each of the inductors 331 and 332 was set to 15.5 nH, and R of each of the gate resistors 321, 322 and 323 was set to 10 kΩ was checked. The insertion loss at the time of input of a small signal became 0.4 dB at a frequency of 1.9 GHz and the isolation was −35 dB. In the range of Pin from 0 to 18 dBm, 2fo monotonously increases but 2fo rapidly increases after Pin becomes larger than 18 dBm.

The monitoring result of the potential concerning the electrode of the FET 312 set in the OFF state is shown in FIGS. 4A to 4E. The nodes α, β, and γ are defined as shown in FIG. 3 and variations in the potentials over time on the respective nodes when the input power Pin is set to 19 dBm are shown in FIGS. 4A to 4C on the same time base. If the maximum potentials of the respective nodes (electrodes) are set to Vα, Vβ, and Vγ, then Vβ=2.8 V (amplitude ΔV=2.8 V, the same representation is used after this), Vα=−0.9 V (ΔV=1.8 V), and Vγ=0 V (ΔV=0 V).

Therefore, in this case, the voltages between the electrodes of the FET 312 are set such that Vγβ=2.8 V, Vαγ=−0.9 V and Vαβ=−1.7 V as shown in FIGS. 4C to 4E. Since Vαγ is larger than Vth (=−1.0 V), the FET 312 is set in the ON state (FIG. 4B). Thus, it is considered that 2fo is increased because the FET 312 which has been set in the OFF state starts to be turned ON.

For example, the specification determined by the RCR standard in the PHS (Personal Handy-phone System) requires that the maximum input power in which the second distortion is less than −50 dBc (which is represented by maxPin@2fo<−50 dBc) be equal to or higher than 21 dBm. In the case of a parallel resonance type switching circuit, the value of maxPin@2fo<−50 dBc is 18.8 dBm. This value does not satisfy the RCR standard.

Thus, in the parallel resonance type switching circuit, if the signal input terminal 302 is used as the terminal of a power transmission path on the transmission side and the signal input terminal 303 is used as the terminal of a small signal transmission path on the reception side, there occurs a problem that an input signal is distorted and a linear output cannot be obtained when a large electric power is input to the terminal 302 on the transmission side and the input signal is supplied to the antenna terminal 301 via the FET 311 set in the ON state.

This is because the potentials on the gate electrode (node$\alpha$), source electrode (node$\beta$) and drain electrode (node$\gamma$) of the FET 312 set in the OFF state are influenced by the input signal via the coupling capacitors (Cgs, Cgd, Cds) of the FET and they come to have AC amplitudes dependent on the input amplitude when a large input signal is supplied to the power transmission path on the transmission side, and as a result, Vgs (V$\alpha\beta$) or Vgd (V$\alpha\gamma$) of the FET 312 increases until it exceeds the breakdown voltage (withstand voltage) of the FET.

When the linear output cannot be obtained and, for example, if a switch for selectively switching the antenna of the digital cordless telephone to the transmission or reception state is used, interference waves may be caused as spurious noise and may cause a serious problem.

This invention has been made to solve the above problem and provide a switching circuit capable of attaining a high withstand voltage and obtaining a linear output when a large power is transmitted while maintaining the advantage of the parallel resonance type switching circuit.

There will now be described embodiments of this invention with reference to the accompanying drawings.

(First Embodiment)

FIG. 5 is a circuit diagram of an SPDT switching circuit according to a first embodiment of this invention, and FIGS. 6A to 6I are waveform diagrams showing variations in potentials on nodes or between nodes in the circuit shown in FIG. 5.

In FIG. 5, an input/output terminal 501 for high-frequency signal is connected to an input/output terminal 502 via an FET 511, and the signal input/output terminal 501 is connected to a signal input/output terminal 503 via FETs 512 and 513.

A signal input/output terminal 504 is connected to the gate of the FET 511 via a gate resistor 521. A gate signal input terminal 505 is connected to the gates of the FET 512 and 513 via respective gate resistors 522 and 523.

Inductors 531 and 532 are connected between the source electrodes and drain electrodes of the FETs 511 and 512, respectively. The inductors 531 and 532 construct parallel resonance circuits in cooperation with capacitors of the OFF-state FETs 511 and 512 and are designed to have inductances determined according to the capacitances of the OFF-state FETs so that the impedances thereof will become maximum at a frequency of 1.9 GHz used for digital cordless telephones.

Further, one end of a capacitor 541 is connected to a connection node of the FETs 512 and 513. A power supply terminal 506 for setting a reference potential is connected to a connection node 507 of the FETs 511 and 513 via a high-resistance resistor 524 and connected to the signal input/output terminal 503 via a high-resistance resistor 525. The FETs 511, 512 and 513 are depletion type FETs.

A case wherein the signal input/output terminal 501 is used as an antenna signal terminal Ant, the signal input/output terminal 502 is used as a terminal Tx of the power transmission path on the transmission side, and the signal input/output terminal 503 is used as a terminal Rx of the small-signal transmission path on the reception side is considered.

When 0 V is applied to the gate signal input terminal 504, −2.7 V is applied to the gate signal input terminal 505 and 0 V is applied to the power supply terminal 506, then the FET 511 is turned ON, the FETs 512 and 513 are turned OFF, and a signal input from the terminal Tx on the transmission side is supplied to the antenna signal terminal Ant via the ON resistor of the FET 511.

Next, the elements are explained. The gate widths Wg of the FETs 511 and 512 are all set to 1 mm, the gate width Wg of the FET 513 is set to 400 µm, and the threshold voltages Vth thereof are all set to −1.0 V. The FET is a multi-finger type FET (which is comprised of series-connected unit transistors), each unit transistor having a unit gate width of 100 µm.

The inductors 531 and 532 are rectangular spiral inductors, each having inductance L of 15.5 nH, a line width of 10 µm, a space of 5 µm, a film thickness of 3 µm, and a one-side length of 340 µm. The resistance R of each of the gate resistors 521, 522, 523, 524 and 525 is 10 k$\Omega$ and the capacitance of the capacitor 541 is 0.5 pF.

In this embodiment, by connecting the capacitor 541 to the connection node of the first FET 512 and the second FET 513, the impedance of the second FET 513 can be made equal to the impedance of the first FET 512 having the inductor for parallel resonance and an adequately divided voltage can be applied to the single FET. Therefore, the OFF state of the FET can be stably maintained when a large signal is input and the linear characteristic at the time of large power input can be further enhanced.

The monitoring results of the potentials of the respective electrodes (nodes) in this embodiment are shown in FIGS. 6A to 6I on the same time base. In this circuit, a high-frequency power input to the Tx terminal 502 is set to Pin=22 dBm. The maximum potentials of the respective electrodes are set to V$\Delta$3=4.0 V (amplitude$\Delta$V=4.0 V), V$\alpha$3=0.3 V ($\Delta$V=3.0 V), V$\gamma$3=V$\beta$2=2.2 V ($\Delta$V=2.2 V), V$\alpha$2=−1.2 V ($\Delta$V=1.5 V), and V$\gamma$2=0 V ($\Delta$V=0 V).

Therefore, in the FET 513, V$\beta$3$\gamma$3=1.8 V, V$\alpha$3$\gamma$3=−1.9 V and V$\alpha$3$\beta$3=−3.7 V, and in the FET 512, V$\beta$2$\gamma$2=2.2 V, V$\alpha$2$\gamma$2=−1.2 V and V$\gamma$2$\beta$2=−2.2 V. The FETs 512 and 513 are set in the OFF state.

Figure 7:
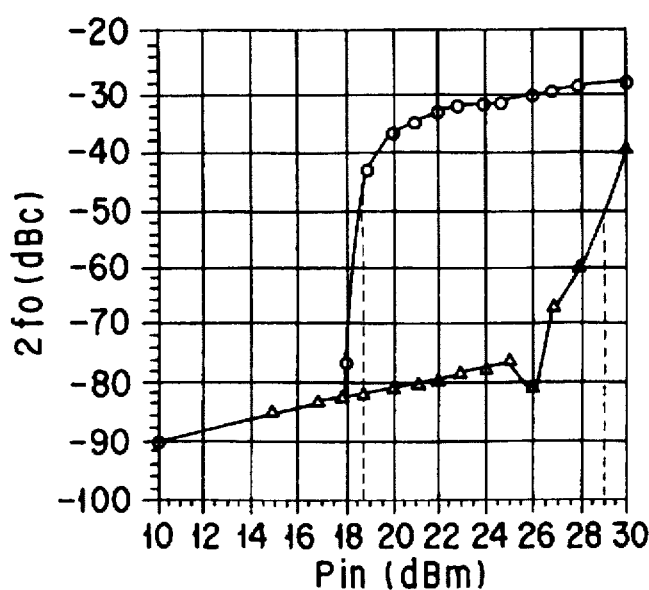
FIG. 7 is a diagram showing the relation between the second order distortion and the input power in the first embodiment of this invention.

The relation between Pin and 2fo of a switch formed in the above condition is indicated by $\Delta$ marks in FIG. 7. The same relation of the parallel resonance type switch described prior to the explanation of the embodiment as a comparative sample is indicated by $\bigcirc$ marks. The abscissa indicates Pin and the ordinate indicates 2fo.

According to this embodiment, 2fo monotonously increases while Pin is set in a range of 0 to 24.5 dBm, but when Pin exceeds 26 dBm, 2fo rapidly increases and the value of (maxPin@2fo<−50 dBc) is 28.5 dBm. This value has a sufficiently large margin with respect to the RCR standard (maxPin@2fo<−50 dBc$\geq$21 dBm) and produces no practical problem.

3fo rapidly increases after Pin exceeds 25 dBm. The insertion loss at the time of small signal input is 0.38 dB at a frequency of 1.9 GHz and the isolation is −40 dB.

In this embodiment, $V\alpha2\gamma2$ of the FET 512 is as small as −1.6 V and the FET can maintain the OFF state.

Further, in the insertion loss and isolation in this embodiment, the insertion loss is 0.38 dB at a frequency of 1.9 GHz and the isolation is −40 dB, and thus a preferable result can be obtained.

Figure 8:
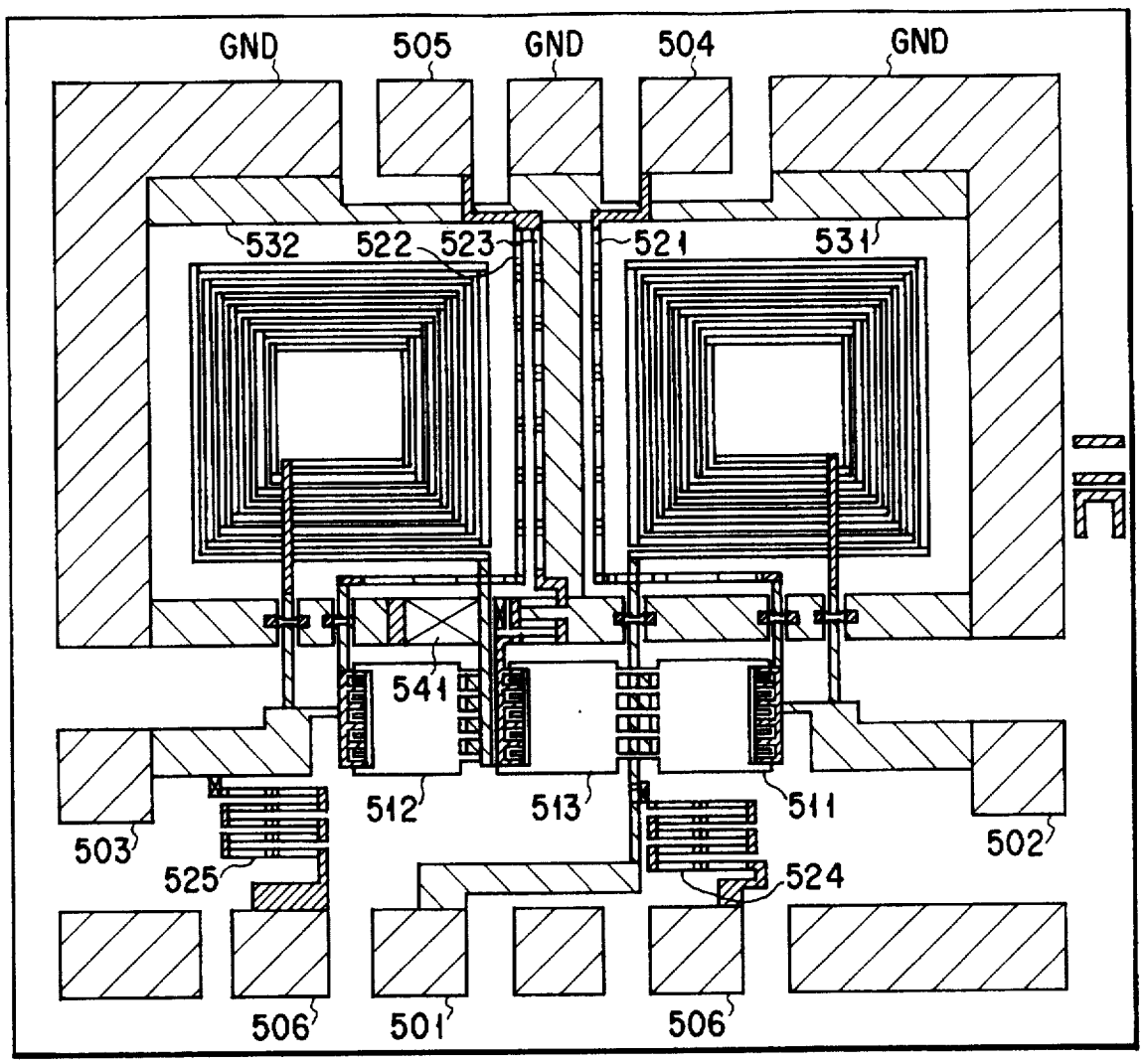
FIG. 8 is a view showing the layout pattern obtained when the first embodiment is applied to an MMIC.

FIG. 8 shows the layout pattern of the MMIC switch. The reference numerals used in FIG. 8 correspond to those of FIG. 5. In the right side portion, the terminal 502 of the power transmission path on the transmission side is provided, in the left side portion, the terminal 503 of the small signal transmission path on the reception side is provided, in the central lower portion, the antenna terminal 501 and power supply terminal 506 are provided, and in the central upper portion, the gate signal input terminal 505 is provided. Further, in the right side portion, the inductor 531 used for the power transmission path is arranged, and in the left side portion, the inductor 532 used for the small signal transmission path is arranged. In addition, the FET 511 used for the power transmission path is arranged in the right side portion and the FETs 512 and 513 used for the power transmission path are arranged in the central and left side portions. In order to prevent the interference between the two inductors, a GND plane is provided therebetween. The chip size is 1.1 mm×1.0 mm.

In this embodiment, the resistors 521, 522, 523, 524 and 525 are used in lines through which the DC power supply voltage is supplied, but the purpose of using the resistors is to cut off the RF signal component in the DC power and it is possible to use inductors to serve the same purpose.

Further, in this invention, the second transmission path via which a larger power than in the first transmission path is passed can be formed with a conventional construction of an FET and a resistor other than the construction of the third FET 511 and the inductor 531.

(Second Embodiment)

Figure 9:
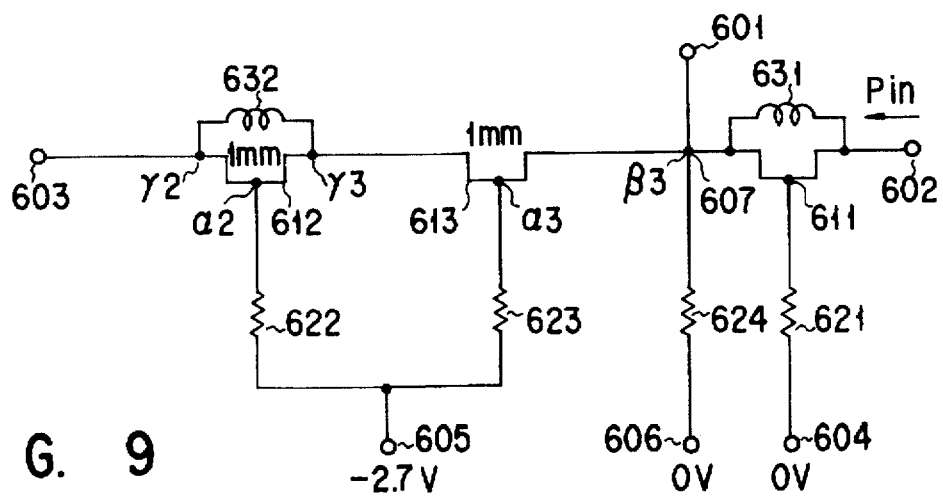
FIG. 9 is a circuit diagram of a parallel resonance type switching circuit according to a second embodiment of this invention.

FIG. 9 is a circuit diagram of a switching circuit according to a second embodiment of this invention, and FIGS. 10A to 10I are waveform diagrams showing variations in potentials over time on nodes or between nodes in the circuit shown in FIG. 9 on the same time base. In FIGS. 10A to 10I, solid lines show the waveforms at Pin=19 bBm, and broken lines show waveforms at Pin=22 dBm.

An input/output terminal 601 for high-frequency signal is connected to an input/output terminal 602 via an FET 611 and connected to a signal input/output terminal 603 via FETs 612 and 613. The FETs 612 and 613 used for the small signal transmission path are serially connected.

A gate signal input terminal 604 is connected to the gate of the FET 611 via a gate resistor 621. A gate signal input terminal 605 is connected to the gates of the FETs 612 and 613 via gate resistors 622 and 623, respectively.

Inductors 631 and 632 are connected between the drain electrodes and source electrodes of the FETs 611 and 612, respectively. The inductors 631 and 632 construct parallel resonance circuits in cooperation with the capacitors of the OFF-state FETs 611 and 612 and the inductances thereof are determined to adequate values according to the capacitances of the OFF-state FETs so that the impedances thereof will become maximum at a frequency of 1.9 GHz used for digital cordless telephones, for example.

A power supply terminal 606 for setting the reference potential is connected to a connection node 607 of the FETs 611 and 613 via a high-resistance resistor 624. The FETs 611, 612 and 613 are depletion type FETs.

Figure 11:
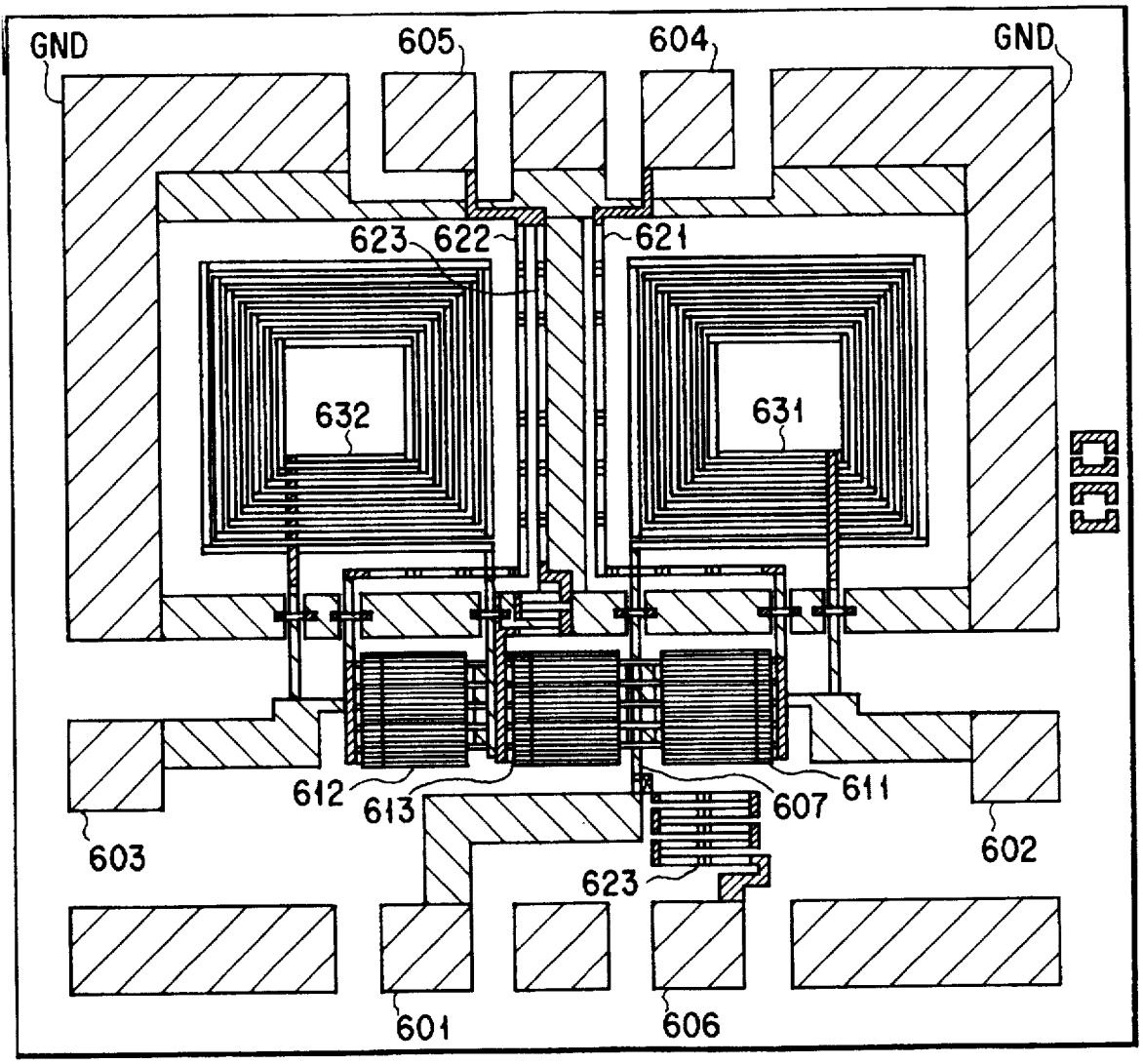
FIG. 11 is view showing the layout pattern obtained when second embodiment is applied to an MMIC.

FIG. 11 is a layout view of an MMIC having the above circuit actually formed on a chip.

The operation of the above switch effected in a case wherein the signal input/output terminal 601 is used as an antenna signal terminal Ant, the signal input/output terminal 602 is used as a terminal Tx of the power transmission path on the transmission side, and the signal input/output terminal 603 is used as a terminal Rx of the small-signal transmission path on the reception side is explained.

When 0 V is applied to the gate signal input terminal 604, −2.7 V is applied to the gate signal input terminal 605 and 0 V is applied to the power supply terminal 606, then the FET 611 is turned ON and the FETs 612 and 613 are turned OFF. When a signal input from the terminal Tx on the transmission side is supplied to the antenna signal terminal Ant via the ON resistor of the FET 611, a signal obtained by subtracting the influence by the loss of leakage current into the small signal transmission path on the OFF side and the ON resistor of the FET 611 from the input signal is supplied to the antenna terminal Ant.

The leakage of the signal into the small signal transmission path on the OFF side is determined by the ratio of the impedance Z of the small signal transmission path on the OFF side to the resistance of a 50Ω terminal resistor connected to the antenna terminal Ant. As the impedance Z of the small signal transmission path on the OFF side is larger, the loss of insertion from the terminal Tx on the transmission side into the antenna terminal Ant is reduced.

Figure 12A:
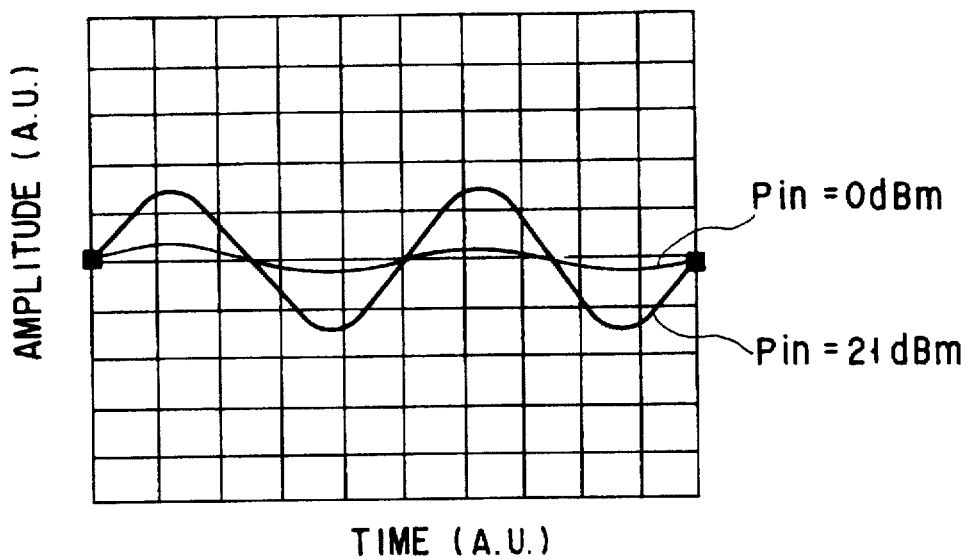
FIGS. 12A and 12B are diagrams for illustrating the linear characteristic of this invention, FIG. 12A showing the case of the second embodiment and FIG. 12B showing the case of a comparative sample based on the circuit shown in FIG. 3 on the same time base.
Figure 12B:
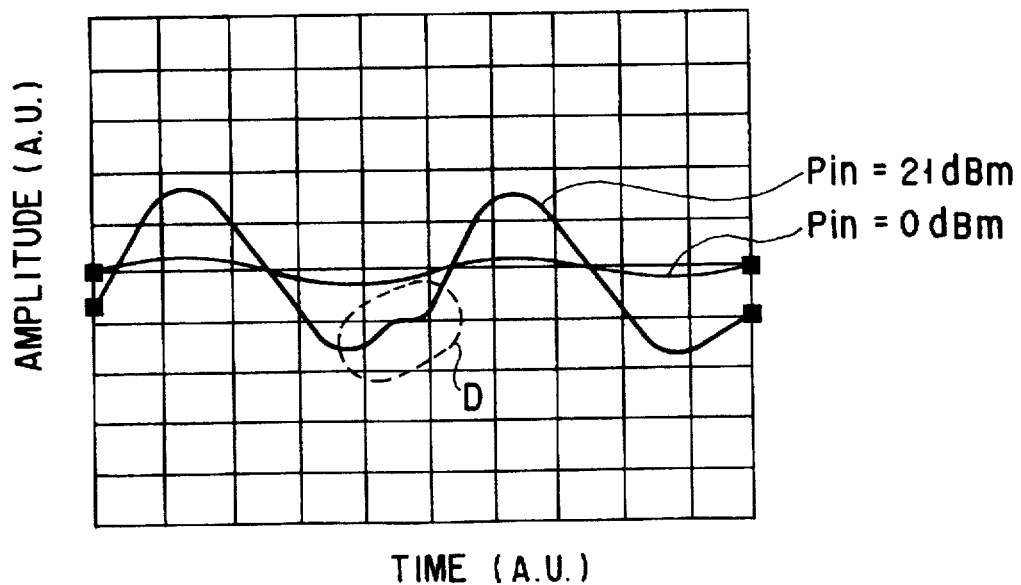

The results of comparison by simulation of the linear characteristic of the parallel resonance type high-frequency switch (comparative sample) explained prior to the preferred embodiments with that of the second embodiment are shown in FIGS. 12A and 12B. FIG. 12A shows the waveform in the case of this embodiment and FIG. 12B shows the waveform the in the case of the parallel resonance type high-frequency switch of the comparative sample explained prior to the preferred embodiments.

In the above simulation, 0.6 µm GaAs MESFETs are used as the FETs 611, 612, (both in FIG. 9), 311 and 312, (both in FIG. 3) and the gate widths thereof are all set to 1 mm. The power supply voltage is set to 2.7 V and the threshold voltages (Vth) of the FETs are all set to −1 V. Further, the resistance of the high-resistance of the resistor 624 is set to 18 kΩ. The inductance of the inductor is set to 15.5 nH.

The input signal is a single tone input of 1.9 GHz and the input power with Pin=0 dBm or Pin=21 dBm is input via Tx. For example, when it is assumed to use a digital cordless telephone, a typical power supplied from the power amplifier is approximately Pin=21 dBm. As shown in FIG. 12B, distortion occurs in the waveform at the time of Pin=21 dBm (D portion). This is because the FET set in the OFF state will be turned ON for AC current. The waveform of FIG. 12A shows a normal waveform. This is obtained based on the effect that the divided voltage is applied to each FET in the case of this invention.

Figure 13A:
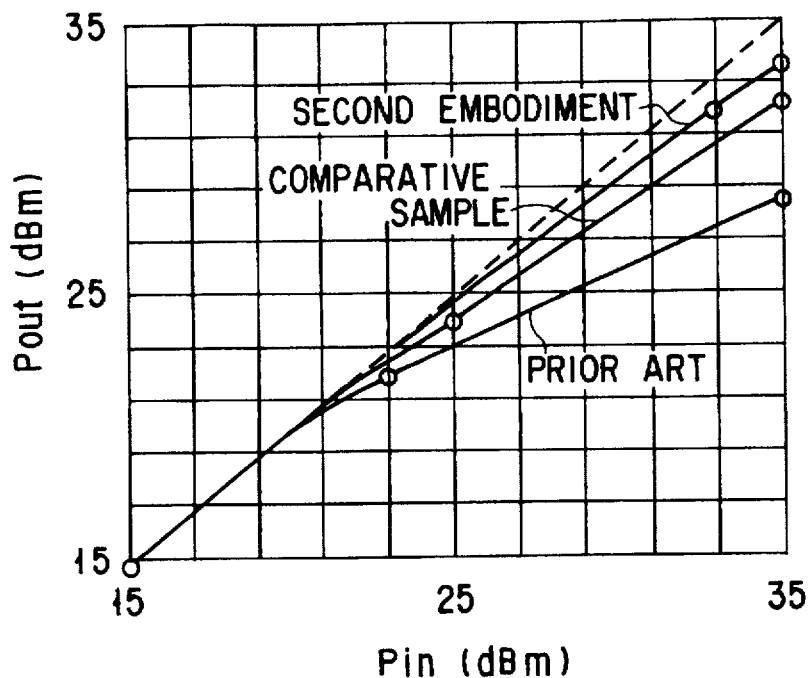
FIGS. 13A and 13B are diagrams for illustrating the characteristic of the second embodiment, FIG. 13A showing the input/output characteristic and FIG. 13B showing the relation between the second order distortion and the input power.

FIG. 13A shows the Pin-Pout characteristic. In comparison with a 1-dB compression point (P1dB) at which the output is lowered than that of the extrapolation line by 1 dB, it is understood that the linearity can be attained in a range to a point of 23 dB in the case of the high-frequency switch in the prior art and to a point of 33 dB in the case of the high-frequency switch according to the second embodiment of this invention and thus the linear characteristic is improved. Further, the parallel resonance type switching circuit of comparative sample exhibits a characteristic of P1dB=25 dB.

Figure 13B:
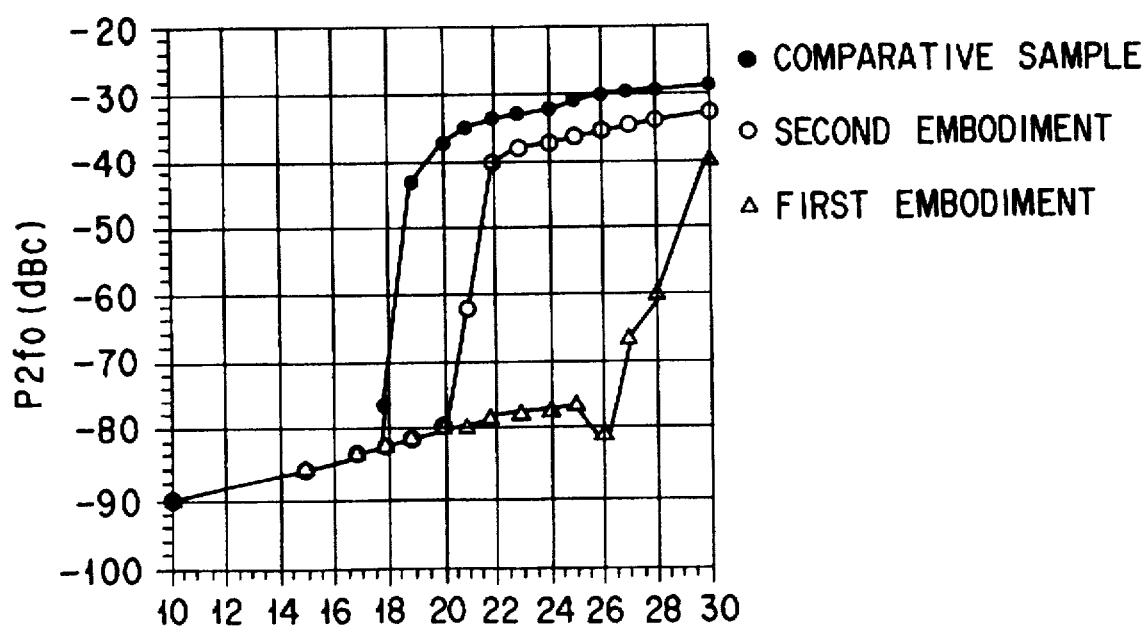

A second order distortion (2fo) is shown in FIG. 13B as the harmonics distortion. Assuming that the input power is a single tone input of 1.9 GHz and the comparison is made in the case of Pin=21 dBm, the harmonics distortion indicates −35 dBc in the case of the parallel resonance type switching circuit of comparative sample and −60 dBc in the case of the switching circuit of the second embodiment and thus the harmonics distortion is improved. The loss and isolation in the case of the parallel resonance type switching circuit of comparative sample are respectively 0.4 dB and 35 dB, and the loss and isolation in the case of the second embodiment are 0.4 dB and 36 dB. Therefore, the low loss and high isolation which are the advantages of the parallel resonance type high-frequency switch can be maintained.

According to this embodiment, by connecting FETs of two or more stages in series with the small signal transmission path (or using a Dual-gate or cascode-connected FETs), the effect that the divided voltage is applied to each FET in the small signal transmission path when the FET is turned OFF can be attained. As a result, the transmission path is formed to have a high withstand voltage and a linear output can be obtained even when a larger output is trans-mitted. Further, the low loss, high isolation, small number of elements and flexibility which are the advantages of the parallel resonance type switch can be maintained and the linear output can be obtained while the FETs connected to the small signal transmission path are formed with 2-stage series construction.

(Third Embodiment)

FIG. 14 is a circuit diagram of an SPDT switch according to a third embodiment of this invention and designed for use as an antenna switch in the digital cordless telephone and FIGS. 15A to 15I are waveform diagrams showing variations in potentials on the same time base on nodes or between nodes in the circuit shown in FIG. 14 at Pin=22 dBm.

In FIG. 14, an input/output terminal 701 for high-frequency signal is connected to an input/output terminal 702 via an FET 711 and connected to a signal input/output terminal 703 via FETs 712 and 713.

A gate signal input terminal 704 is connected to the gate of the FET 711 via a gate resistor 721. A gate signal input terminal 705 is connected to the gates of the FETs 712 and 713 via gate resistors 722 and 723, respectively. Inductors 731 and 732 are connected between the drain electrodes and source electrodes of the FETs 711 and 712, respectively.

The inductors 731 and 732 construct parallel resonance circuits in cooperation with the capacitors of the OFF-state FETs 711 and 712, and the inductances thereof are determined to adequate values according to the capacitances of the OFF-state FETs, so that the impedances thereof will become maximum at a frequency of 1.9 GHz used for digital cordless telephones.

A power supply terminal 706 for applying the reference potential is connected to a connection node 707 of the FETs 711 and 713 via a high-resistance resistor 724 and connected to the signal input/output terminal 703 via a high-resistance resistor 725. The FETs 711, 712 and 713 are depletion type FETs.

A case wherein the signal input/output terminal 701 is used as an antenna signal terminal Ant, the signal input/output terminal 702 is used as a terminal Tx of the power transmission path on the transmission side, and the signal input/output terminal 703 is used as a terminal Rx of the small-signal transmission path on the reception side is considered.

When 0 V is applied to the gate signal input terminal 704, −2.7 V is applied to the gate signal input terminal 705 and 0 V is applied to the power supply terminal 706, then the FET 711 is turned ON, the FETs 712 and 713 are turned OFF, and a signal input from the terminal Tx on the transmission side is supplied to the antenna signal terminal Ant via the ON resistor of the FET 711.

Next, the elements are explained. The gate widths Wg of the FETs 711 and 712 are all set to 1 mm, the gate width Wg of the FET 713 is set to 400 μm, and the threshold voltages Vth thereof are all set to −1.0 V. The FET is a multi-finger type FET constructed by a plurality of unit FETs with the unit gate width of 100 μm.

The inductors 731 and 732 are rectangular spiral inductors having inductance L of=15.5 nH, a line width of 10 μm, a space of 5 μm, a film thickness of 3 μm, and a one-side length of 340 μm. The resistance R of each of the gate resistors 721, 722, 723, 724 and 725 is 10 kΩ.

From the monitoring result of the potentials of the respective electrodes in a case of Pin=22 dB in the circuit of this embodiment effected for comparison with the circuit of the second embodiment in which the gate width Wg is set to 1 mm, the maximum potentials of the respective electrodes (nodes) are set to V$\beta$3=4.0 V (amplitude $\Delta$V=4.0 V), V$\alpha$3= 0.3 V ($\Delta$V=3.0 V), V$\beta$3=2.2 V ($\Delta$V=2.2 V), V$\alpha$2=−1.2 V ($\Delta$V=−1.5 V), and V$\gamma$2=0 V ($\Delta$V=0 V).

Therefore, in the FET 713, V$\beta$3$\gamma$3=1.8 V, V$\alpha$3$\gamma$3=−1.9 V and V$\alpha$3$\gamma$3=−3.7 V, and in the FET 712, V$\alpha$3$\gamma$2=2.2 V, V$\alpha$2$\gamma$2=−1.3 V, and V$\alpha$2$\gamma$3=−2.2 V. The FETs 712 and 713 are set in the OFF state.

On the other hand, in the case of the circuit of the second embodiment (refer to broken lines in FIGS. 10A to 10I), V$\beta$3=4.0 V ($\Delta$V=4.1 V), V$\alpha$3=0.7 V ($\Delta$V=3.4 V), V$\gamma$3=2.6 V ($\Delta$V=2.6 V), V$\alpha$2=−0.7 V ($\Delta$V=2.0 V), and V$\gamma$2=0 V ($\Delta$V=0 V). In comparison with the second embodiment, in this embodiment, it is understood that the amplitudes of the voltages on the respective nodes in the FET 712 are reduced and the FET is difficult to be turned ON. This is considered to be because the gate width of the FET 713 is reduced to reduce the coupling capacitance and the power from the ON side is difficult to leak through the FET 713 so as to reduce the amplitudes of the potentials on the respective nodes.

Figure 16:
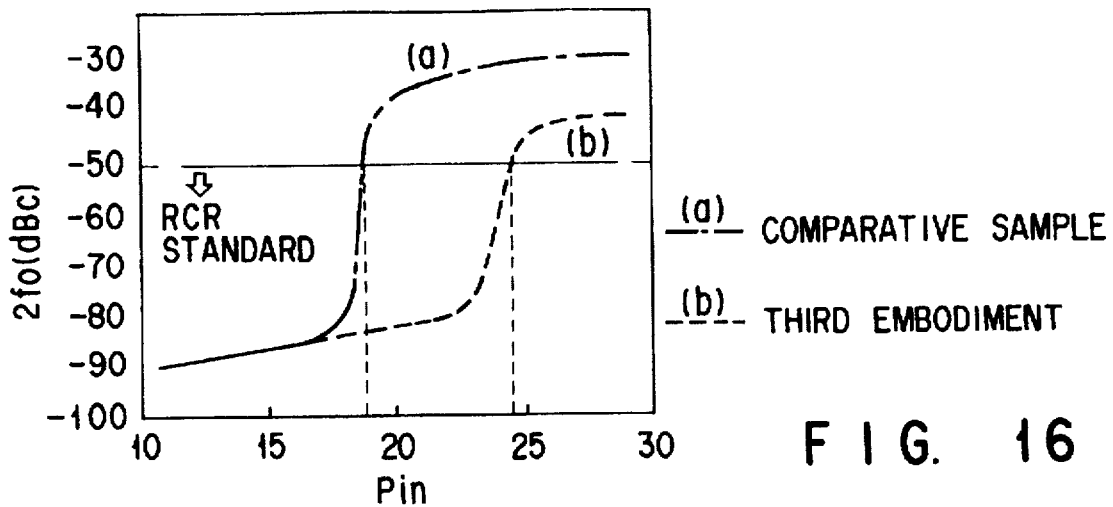
FIG. 16 is a diagram showing the relation between the second order distortion and the input power.

In this embodiment, as shown in FIG. 16, the value of (maxPin@2fo<−50 dBc) is 24.5 dBm and the RCR standard can be satisfied with large margin by making the gate width of the FET 713 series-connected with the FET 712 smaller than the gate width of the FET 712.

Further, in this embodiment, the insertion loss at a frequency of 1.9 GHz is 0.35 dB and the isolation is −38 dB and this is considered to be because the impedance on the OFF side is further increased by reducing the gate width of the FET 713.

(Fourth Embodiment)

Figure 17:
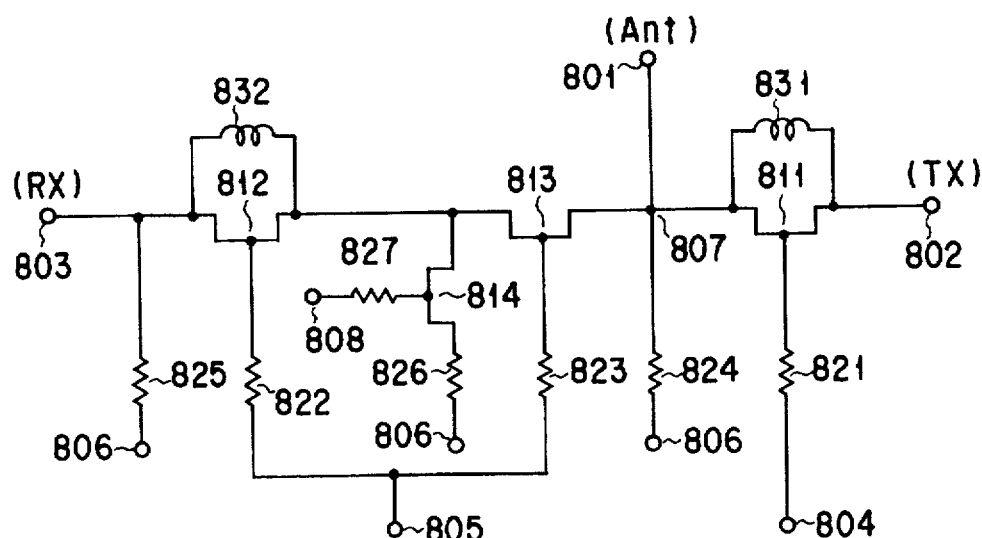
FIG. 17 is a circuit diagram of a high-frequency switch according to a fourth embodiment of this invention.

FIG. 17 is a circuit diagram of an SPDT switch according to a fourth embodiment of this invention. In FIG. 17, an input/output terminal 801 for high-frequency signal is connected to an input/output terminal 802 via an FET 811 and connected to a signal input/output terminal 803 via FETs 812 and 813.

A gate signal input terminal 804 is connected to the gate of the FET 811 via a gate resistor 821. A gate signal input terminal 805 is connected to the gates of the FETs 812 and 813 via gate resistors 822 and 823, respectively. Inductors 831 and 832 are connected between the drain electrodes and source electrodes of the FETs 811 and 812, respectively.

The inductors 831 and 832 construct parallel resonance circuits in cooperation with the capacitors of the OFF-state FETs 811 and 812, and the inductances thereof are determined to adequate values according to the capacitances of the OFF-state FETs, so that the impedances thereof will become maximum at a frequency of 1.9 GHz used for digital cordless telephones.

A power supply terminal 806 for applying a first reference potential is connected to a connection node 807 of the FETs 811 and 813 via a high-resistance resistor 824, connected to the signal input/output terminal 803 via a high-resistance resistor 825 and connected to the source electrode (or drain electrode) of the FET 814 via a high-resistance resistor 826.

Further, a power supply terminal 808 for applying a second reference potential is connected to the gate of the FET 814 via a high-resistance resistor 827. The FETs 811, 812, 813 and 814 are depletion type FETs.

A case wherein the signal input/output terminal 801 is used as an antenna signal terminal Ant, the signal input/output terminal 802 is used as a terminal Tx of the power transmission path on the transmission side, and the signal input/output terminal 803 is used as a terminal Rx of the small-signal transmission path on the reception side is considered.

When 0 V is applied to the gate signal input terminal 804, −2.7 V is applied to the gate signal input terminal 805, 0 V is applied to the power supply terminal 806 and −2.7 V is applied to the power supply terminal 808, then the FET 811 is turned ON, the FETs 812, 813 and 814 are turned OFF, and a signal input from the terminal Tx on the transmission side is supplied to the antenna signal terminal Ant via the ON resistor of the FET 811.

Next, the elements are explained. The gate widths Wg of the FETs 811, 812, 813 and 814 are all set to 1 mm, and the threshold voltages $V_{th}$ thereof are all set to −1.0 V. The FET is a multi-finger type FET constructed by a plurality of unit FETs with the unit gate width of 100 m.

The inductors 831 and 832 are rectangular spiral inductors, each having inductance L of 15.5 nH, a line width of 10 $\Omega$m, a space of 5 $\Omega$m, a film thickness of 3 µm, and a one-side length of 340 µm. The resistance R of each of the gate resistors 821, 822, 823, 824, 825, 826 and 827 is set to 10 k$\Omega$.

Figure 18:
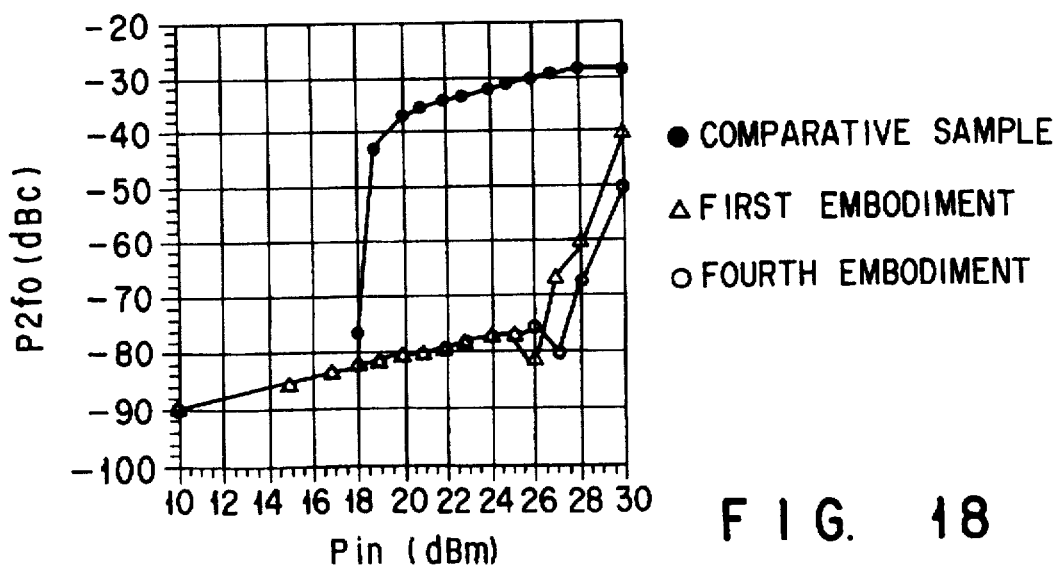
FIG. 18 is a diagram showing the relation between the second order distortion and the input power.

The relation between Pin and 2fo of a switch formed in the above condition is shown in FIG. 18. In this embodiment, the value of (maxPin@2fo<−50 dBc) is 30.0 dBm and is improved over that of the switching circuit of the first embodiment by 1.0 dBm. This is because the capacitance of the capacitor 541 is deviated from the capacitance of the OFF-state FET 513 and Vds of the FET 513 is made slightly different from Vds of the FET 512 in the case of the switching circuit of the first embodiment, but in this embodiment, the capacitances of the OFF-state FETs 813 and 814 are substantially equal to each other, the voltage can be adequately divided and Vds of the FET 813 is equal to Vds of the FET 814.

Further, evaluation was made by supplying 100 wafers (100 chips/wafers) and it was found that the yield in the first embodiment was 60%, but in this embodiment, the yield was enhanced to 80% since the circuit of this embodiment was not influenced by a variation in the FET characteristic in the manufacturing process and the voltage applied between the source and drain of each FET could be adequately divided.

The layout size of this embodiment is substantially the same as that of the first embodiment. In order to prevent the interference between the two inductors, a GND plane is provided between the inductors. The chip size is 1.1 mm×1.0 mm.

In this invention, a case wherein the high-resistance resistor is used in a line through which the DC power supply voltage is supplied is explained, but the purpose of using the resistor is to cut off the RF signal component in the DC power, and it is of course possible to use inductors to serve the same purpose.

As described above, according to the switching circuit of this invention, a high withstand voltage can be attained and a sufficiently linear output can be obtained when a larger power is transmitted.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A switching circuit comprising:
   a first transmission path;
   a first input/output terminal connected to one end of said first transmission path;
   a second input/output terminal connected to the other end of said first transmission path, said first transmission path including a first field effect transistor having a first conduction path which is connected at one end to said first input/output terminal; a second field effect transistor having a second conduction path which is connected at one end to the other end of the first conduction path of said first field effect transistor and connected at the other end to said second input/output terminal; and a first inductor connected in parallel with the first conduction path of said first field effect transistor, said second field effect transistor being devoid of a paralleled inductor;
   a second transmission path connected at one end thereof to said second input/output terminal;
   a third input/output terminal, which is isolated from said first input/output terminal, connected to the other end of said second transmission path; and
   means for decreasing a difference between a voltage applied to the first conduction path of said first field effect transistor and a voltage applied to the second conduction path of said second field effect transistor, when said first and said second transistors are in an OFF state.

2. A switching circuit according to claim 1, wherein said second transmission path includes a third field effect transistor having a third conduction path which is connected between said second and said third input/output terminal; and a second inductor connected in parallel with the third conduction path.

3. A switching circuit according to claim 2, wherein said first input/output terminal is connected to a reception circuit, said second input/output terminal is connected to an antenna, and said third input/output terminal is connected to a transmission circuit so as to switch high-frequency signals of reception and transmission.

4. A switching circuit according to claim 3, wherein a capacitance which said first field effect transistor has in an OFF state and said first inductor resonate at a preset frequency of the high-frequency signals.

5. A switching circuit according to claim 3, wherein a capacitance which said third field effect transistor has in an OFF state and said second inductor resonate at a preset frequency of the high-frequency signals.

6. A switching circuit according to claim 1, wherein said second input/output terminal is coupled to a reference potential via a resistor, and preset voltages applied to gate electrodes of said first and said second field effect transistor via respective preset resistors to control conduction states of the first and the second conduction path, respectively.

7. A switching circuit according to claim 1, wherein said first and said second transistor is a depletion type transistor.

8. A switching circuit according to claim 2, wherein a reference potential is applied to said second input/output terminal via a resistor and a preset voltage is applied to a gate electrode of said third field effect transistor via a preset resistor to control a conduction state of the third conduction path.

9. A switching circuit according to claim 2, wherein said third transistor is a depletion type transistor.

10. A switching circuit according to claim 1, wherein said means for decreasing a difference comprises a voltage terminal to which a preset voltage is applied and a capacitor connected between the other end of the first conduction path of said first transistor and said voltage terminal.

11. A switching circuit according to claim 1, wherein said second field effect transistor is a multi-finger type field effect transistor having a plurality of gate electrodes connected to one another.

12. A switching circuit according to claim 1, wherein said means for decreasing a difference comprises a construction such that a gate width of said second field effect transistor is smaller than a gate width of said first field effect transistor.

13. A switching circuit according to claim 11, wherein the total gate width of the plurality of gate electrodes of said second field effect transistor is smaller than a gate width of said first field effect transistor.

14. A switching circuit according to claim 1, wherein said means for decreasing a difference comprises a voltage terminal to which a preset voltage is applied and a fourth transistor having a fourth conduction path connected between the other end of the first conduction path of said first transistor and said voltage terminal to which the preset voltage is applied.

15. A switching circuit comprising:
a first input/output terminal;
a first field effect transistor having a first source electrode connected to said first input/output terminal, a first drain electrode and a first gate electrode;
a first inductor connected between the first source electrode and the first drain electrode;
a second field effect transistor having a second source electrode connected to the first drain electrode, a second drain electrode and a second gate electrode;
a first control terminal for controlling conduction states of said first and said second field effect transistor;
a first resistor connected between said first control terminal and the first gate electrode;
a second resistor connected between said first control terminal and the second gate electrode;
a second input/output terminal connected to the second drain electrode;
a first voltage terminal for applying a reference potential;
a third resistor connected between said voltage terminal and said second input/output terminal;
a third field effect transistor having a third source electrode connected to said second input/output terminal, a third drain electrode and a third gate electrode;
a second inductor connected between the third source electrode and the third drain electrode;
a third input/output terminal connected to the third drain electrode;
a second control terminal for controlling a conduction state of said third field effect transistor; and
a fourth resistor connected between said second control terminal and the third gate electrode.

16. A switching circuit according to claim 15, further comprising a second voltage terminal for applying a preset voltage and a capacitor connected between the first drain electrode and said second voltage terminal.

17. A switching circuit according to claim 15, wherein said second field effect transistor is a multi-finger type field effect transistor having a plurality of gate electrodes connected to one another.

18. A switching circuit according to claim 15, wherein a gate width of said second field effect transistor is smaller than a gate width of said first field effect transistor.

19. A switching circuit according to claim 17, wherein the total gate width of the plurality of gate electrodes of said second field effect transistor is smaller than a gate width of said first field effect transistor.

20. A switching circuit according to claim 15, further comprising a third voltage terminal for applying a preset voltage and a fourth field effect transistor having a fourth source electrode connected to said third voltage terminal, a fourth drain electrode connected to the first drain electrode, and a fourth gate electrode.

* * * * *